US007915827B2

(12) United States Patent
Kasai et al.

(10) Patent No.: US 7,915,827 B2
(45) Date of Patent: Mar. 29, 2011

(54) MAGNETRON CONTROL METHOD, MAGNETRON SERVICE LIFE JUDGMENT METHOD, MICROWAVE GENERATION DEVICE, MAGNETRON SERVICE LIFE JUDGMENT DEVICE, PROCESSING DEVICE, COMPUTER PROGRAM, AND STORAGE MEDIUM

(75) Inventors: Shigeru Kasai, Nirasaki (JP); Yuki Osada, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 295 days.

(21) Appl. No.: 12/044,625

(22) Filed: Mar. 7, 2008

(65) Prior Publication Data
US 2008/0309239 A1  Dec. 18, 2008

Related U.S. Application Data

(63) Continuation of application No. PCT/JP2006/317105, filed on Aug. 30, 2006.

(30) Foreign Application Priority Data

Sep. 8, 2005  (JP) ................................. 2005-260204

(51) Int. Cl.
*H01J 25/50*  (2006.01)
(52) U.S. Cl. ................ 315/39.51; 315/39.57; 315/39.59
(58) Field of Classification Search .................... 315/32, 315/33, 34, 37, 38, 39.51, 39.53, 39.55, 39.57, 315/39.59, 39.67, 39.71, 39.75, 39.77, 40, 315/42, 43, 51, 94, 105, 108, 110, 111.01, 315/111.21, 111.41, 111.71, 291, 299; 438/3, 438/15, 17, 19, 758, 777, 772, 771, 776
See application file for complete search history.

(56) References Cited

U.S. PATENT DOCUMENTS

| 4,445,873 A * | 5/1984 | Tsuzurabara ..................... 445/6 |
| 4,494,034 A * | 1/1985 | Keller ........................... 313/341 |
| 6,653,788 B2 * | 11/2003 | Ogura et al. ............... 315/39.51 |
| 6,847,023 B2 | 1/2005 | Han et al. |
| 2003/0141821 A1 * | 7/2003 | Nakano et al. ........... 315/111.21 |
| 2004/0142577 A1 | 7/2004 | Sugawara et al. |

FOREIGN PATENT DOCUMENTS

| CN | 1485878 A | 3/2004 |
| JP | 55-86039 | 6/1980 |
| JP | 3-77240 A | 4/1991 |
| JP | 5-67493 | 3/1993 |
| JP | 10-223150 A | 8/1998 |
| JP | 2003-297545 A | 10/2003 |
| JP | 2003-308958 | 10/2003 |
| WO | WO 02/58130 A1 | 1/2002 |

* cited by examiner

*Primary Examiner* — Douglas W Owens
*Assistant Examiner* — Jianzi Chen
(74) *Attorney, Agent, or Firm* — Oblon, Spivak, McClelland, Maier & Neustadt, L.L.P.

(57) ABSTRACT

A microwave generation device includes: a magnetron having a cathode containing a filament and an anode containing a hollow resonator arranged to oppose to each other; a filament current measuring unit; and an application voltage measuring unit for measuring voltage applied to the filament. Based on the current and the voltage obtained by the current measuring unit and the voltage measuring unit, a resistance value calculation unit obtains a resistance value of the filament. A temperature calculation unit calculates the filament temperature from the resistance value and the resistance-temperature dependent characteristic. A filament power source is controlled by a power control unit so that the filament temperature is within a predetermined temperature range.

9 Claims, 7 Drawing Sheets

US 7,915,827 B2

MAGNETRON CONTROL METHOD, MAGNETRON SERVICE LIFE JUDGMENT METHOD, MICROWAVE GENERATION DEVICE, MAGNETRON SERVICE LIFE JUDGMENT DEVICE, PROCESSING DEVICE, COMPUTER PROGRAM, AND STORAGE MEDIUM

This application is a Continuation Application of PCT International Application No. PCT/JP2006/317105 filed on 30 Aug. 2006, which designated the United States.

FIELD OF THE INVENTION

The present invention relates to a processing device for performing a desired processing on a surface of a target object such as a semiconductor wafer by using active species activated by a plasma; a magnetron control method; a magnetron service life judgment method; a microwave generation device; a magnetron service life judgment device; a computer program; and a storage medium.

BACKGROUND OF THE INVENTION

In general, various processes such as a film forming process, a quality modification process, an oxidation/diffusion process, an etching process, and the like are performed on a target object such as a semiconductor wafer to manufacture an integrated circuit of a semiconductor product. Recently, with a demand for further increasing the density of the semiconductor integrated circuit while decreasing the film thickness thereof and a demand for a higher level of miniaturization of the semiconductor integrated circuit and a need to process it at a lower temperature, a processing apparatus using plasma tends to be widely employed. In the processing apparatus using the plasma, active species are generated by activating a gas by the plasma, and a desired process can be carried out by the action of the active species in a relatively low temperature state, without having to heat a wafer up to a high temperature. Such plasma processing apparatus using the plasma includes a high frequency wave generation device for generating a high frequency wave or a microwave generation device for generating a microwave, both being employed for the creation of the plasma.

Here, description will be provided for the case of using the microwave generation device, for example. The microwave generation device includes a magnetron configured as a bipolar tube wherein an anode having a cavity resonator is coaxially disposed around a cathode having a filament. In the device, by oscillating a high frequency wave while imposing a DC magnetic field between the two electrodes in an axial direction, a microwave is generated (see, for example, Patent References 1-3).

Specifically, in this magnetron tube, by supplying an electric power to the filament, the cathode is heated so that thermal electrons are released therefrom, as in an ordinary bipolar vacuum tube. At this time, electric current is controlled by an electric field (voltage) applied between the two electrodes. At the same time, by means of creating rotational motion of the thermal electrons by a magnetic field formed in a direction perpendicular to the electric field, an oscillation phenomenon occurs, whereby the microwave is generated.

[Patent Reference 1]
Japanese Patent Laid-open Application No. H5-67493
[Patent Reference 2]
Japanese Patent Laid-open Application No. H10-223150
[Patent Reference 3]
Japanese Patent Laid-open Application No. 2003-308958

The filament of the magnetron is generally made of a tungsten metal material containing a small amount of thorium, and a carbonized layer is formed on the surface of the cathode including the filament to facilitate the release of the thermal electrons. Expiration of the service life of the magnetron is resulted from excessive reduction of this carbonized layer.

A conventional magnetron control method has been as follows. In the event that an output of the magnetron is varied, a voltage applied to the filament (filament voltage) is varied in inverse proportion thereto to lengthen the service life of the filament, whereby an excessive temperature rise of the filament is prevented. For example, if an anode current is increased to enhance the output of the magnetron, the temperature of the filament would be increased as well, resulting in excessive consumption of the carbonized layer. For the reason, when increasing the anode current to enhance the output of the magnetron, the filament voltage is reduced to prevent the temperature rise of the filament, whereby the consumption of the carbonized layer due to the excessive temperature rise is prevented. On the contrary, when the anode current is reduced to decrease the output of the magnetron, the filament voltage is increased.

In the conventional magnetron control method, however, in spite of performing the control of increasing or decreasing the filament voltage in response to the increase or decrease in the output of the magnetron in inverse proportion in order to prevent overheating of the filament, the filament would actually suffer from a considerable variation of its temperature considerably. In some occasion, the filament would be overheated, and the carbonized layer would be consumed excessively, resulting in a great reduction of the service life of the magnetron.

SUMMARY OF THE INVENTION

The present invention has been devised to solve the above-mentioned problems effectively. It is an object of the present invention to provide a magnetron control method capable of extending a service life of a magnetron by means of controlling a filament temperature of a magnetron with a high precision without complicating the structure thereof; a magnetron service life judgment method; a microwave generation device; a magnetron service life judgment device; a processing apparatus; and a storage medium.

Present inventors conducted researches on the oscillation of the magnetron assiduously, and reached a conclusion that the service life of a filament can be lengthened by controlling the temperature of the filament to be kept at a specific level, the temperature being calculated from a voltage applied to the filament and a resistance value obtained based on a current flowing through the filament.

In accordance with a first aspect of the present invention, there is provided a method for controlling a magnetron for generating a microwave, the magnetron including a cathode having a filament, an anode having a cavity resonator and disposed to face the cathode, and a magnetic field generating unit for applying a magnetic field in a direction substantially perpendicular to an arrangement direction of the cathode and the anode, the method including: supplying a power to the filament; calculating a resistance of the filament based on a voltage applied to the filament and a current flowing in the filament; calculating a temperature of the filament based on the resistance of the filament and a previously obtained resistance-temperature dependency characteristic of the filament;

and controlling the temperature of the filament to be kept within a specific temperature range by adjusting the current flowing in the filament and/or the voltage applied to the filament.

As described above, since the temperature of the filament is controlled to be kept within a specific temperature range by adjusting the current flowing in the filament and/or the voltage applied to the filament, it is possible to extend a service life of a magnetron by means of controlling a filament temperature of a magnetron with a high precision without complicating the structure thereof.

Preferably, the specific temperature range is between 1900 and 2100° C. inclusive.

In accordance with a second aspect of the present invention, there is provided a method for determining a service life of a magnetron for generating a microwave, the magnetron including a cathode having a filament, an anode having a cavity resonator and disposed to face the cathode, and a magnetic field generating unit for applying a magnetic field in a direction substantially perpendicular to an arrangement direction of the cathode and the anode, the method including: supplying a power to the filament and operating the magnetron to generate a microwave of a preset frequency; detecting a voltage at which a moding phenomenon occurs by gradually reducing a voltage applied to the filament, and setting the detected voltage as a moding voltage; and determining the service life of the magnetron based on the moding voltage.

Preferably, in determining the service life of the magnetron, it is determined that the service life of the magnetron has expired when the moding voltage reaches a preset percentage of a rated voltage of the filament, or greater.

Preferably, in determining the service life of the magnetron, it is determined that the service life of the magnetron has expired when the moding voltage changes from a previously obtained moding voltage by a preset percentage or greater.

Preferably, the method for determining the service life of the magnetron is performed at a preset timing.

In accordance with a third aspect of the present invention, there is provided a microwave generation device including: a magnetron for generating a microwave, the magnetron including a cathode having a filament, an anode having a cavity resonator and disposed to face the cathode, and a magnetic field generating unit for applying a magnetic field in a direction substantially perpendicular to an arrangement direction of the cathode and the anode; a filament power supply for supplying a variable power to the filament; a current measuring unit for measuring a current flowing in the filament; a voltage measuring unit for measuring a voltage applied to the filament; a resistance value calculation unit for calculating a resistance of the filament based on the current of the filament obtained by the current measuring unit and the voltage of the filament obtained by the voltage measuring unit; a temperature calculating unit for calculating a temperature of the filament based on the resistance obtained by the resistance value calculation unit and a resistance-temperature dependency characteristic obtained previously; and a power supply control unit for controlling the filament power supply to maintain the temperature of the filament obtained by the temperature calculating unit within a specific temperature range.

Preferably, the filament power supply is of a pulse width modulation (PWM) type, and the power supply control unit adjusts a conduction angle.

Preferably, the filament power supply is of a transistor switch on-off type, and the power supply control unit adjusts a gate current of the transistor switch.

Preferably, the specific temperature range is between 1900 and 2100° C. inclusive.

In accordance with a fourth aspect of the present invention, there is provided a magnetron service life judgment device for determining a service life of a magnetron for generating a microwave, the magnetron including a cathode having a filament, an anode having a cavity resonator and disposed to face the cathode, and a magnetic field generating unit for applying a magnetic field in a direction substantially perpendicular to an arrangement direction of the cathode and the anode, the device including: a moding voltage measuring unit for detecting a voltage at which a moding phenomenon takes place by gradually reducing a voltage applied to the filament and setting the detected voltage as a moding voltage; and a service life judging unit for judging the service life of the magnetron based on the moding voltage.

Preferably, the service life judgment unit determines that the service life of the magnetron has expired when the moding voltage reaches a preset percentage of a rated voltage of the filament, or greater.

Preferably, the service life judgment unit determines that the service life of the magnetron has expired when the moding voltage changes from a previously obtained moding voltage by a preset percentage or greater.

In accordance with a fifth aspect of the present invention, there is provided a processing apparatus including: a vacuum evacuable processing vessel; a mounting table for mounting thereon a target object to be processed; a gas introduction unit for introducing a gas into the processing vessel; a microwave generating unit for generating a microwave; a waveguide for transferring the generated microwave; and a microwave irradiating unit for irradiating the transferred microwave to the gas to activate the gas, wherein the microwave generating unit includes: a magnetron for generating a microwave, the magnetron including a cathode having a filament, an anode having a cavity resonator and disposed to face the cathode, and a magnetic field generating unit for applying a magnetic field in a direction substantially perpendicular to an arrangement direction of the cathode and the anode; a filament power supply for supplying a variable power to the filament; a current measuring unit for measuring a current flowing in the filament; a voltage measuring unit for measuring a voltage applied to the filament; a resistance value calculation unit for calculating a resistance of the filament based on the current of the filament obtained by the current measuring unit and the voltage of the filament obtained by the voltage measuring unit; a temperature calculating unit for calculating a temperature of the filament based on the resistance obtained by the resistance value calculation unit and a resistance-temperature dependency characteristic obtained previously; and a power supply control unit for controlling the filament power supply to maintain the temperature of the filament obtained by the temperature calculating unit within a specific temperature range.

Preferably, the microwave irradiating unit is made of a planar antenna member having a plurality of slots.

Preferably, the processing apparatus further includes a magnetron service life judging device having: a moding voltage measuring unit for detecting a voltage at which a moding phenomenon takes place by gradually reducing a voltage applied to the filament and setting the detected voltage as a moding voltage; and a service life judging unit for determining the service life of the magnetron based on the moding voltage.

In accordance with a sixth aspect of the present invention, there is provided a computer program for controlling a microwave generation device to perform a magnetron control method, when generating a microwave by using the microwave generation device including a magnetron for generating the microwave, the magnetron including a cathode having a filament, an anode having a cavity resonator and disposed to face the cathode, and a magnetic field generating unit for applying a magnetic field in a direction substantially perpendicular to an arrangement direction of the cathode and the anode, wherein the control method includes: supplying a power to the filament; calculating a resistance of the filament based on a voltage applied to the filament and a current flowing in the filament; calculating a temperature of the filament based on the resistance of the filament and a previously obtained resistance-temperature dependency characteristic of the filament; and controlling the temperature of the filament to be kept within a specific temperature range by adjusting the current flowing in the filament and/or the voltage applied to the filament.

In accordance with a seventh aspect of the present invention, there is provided a storage medium storing therein a computer program for controlling a microwave generation device to perform a magnetron control method, when generating a microwave by using the microwave generation device including a magnetron for generating the microwave, the magnetron including a cathode having a filament, an anode having a cavity resonator and disposed to face the cathode, and a magnetic field generating unit for applying a magnetic field in a direction substantially perpendicular to an arrangement direction of the cathode and the anode, wherein the control method includes: supplying a power to the filament; calculating a resistance of the filament based on a voltage applied to the filament and a current flowing in the filament; calculating a temperature of the filament based on the resistance of the filament and a previously obtained resistance-temperature dependency characteristic of the filament; and controlling the temperature of the filament to be kept within a specific temperature range by adjusting the current flowing in the filament and/or the voltage applied to the filament.

BRIEF DESCRIPTION OF THE DRAWINGS

The above and other features of the present invention will become apparent from the following description of an embodiment given in conjunction with the accompanying drawings, in which.

DETAILED DESCRIPTION OF THE EMBODIMENTS

Hereinafter, a magnetron control method, a magnetron service life judgment method, a microwave generation device, a magnetron service life judgment device, a processing device and a storage medium in accordance with a first embodiment of the present invention will be described with reference to the accompanying drawings.

Figure 1:
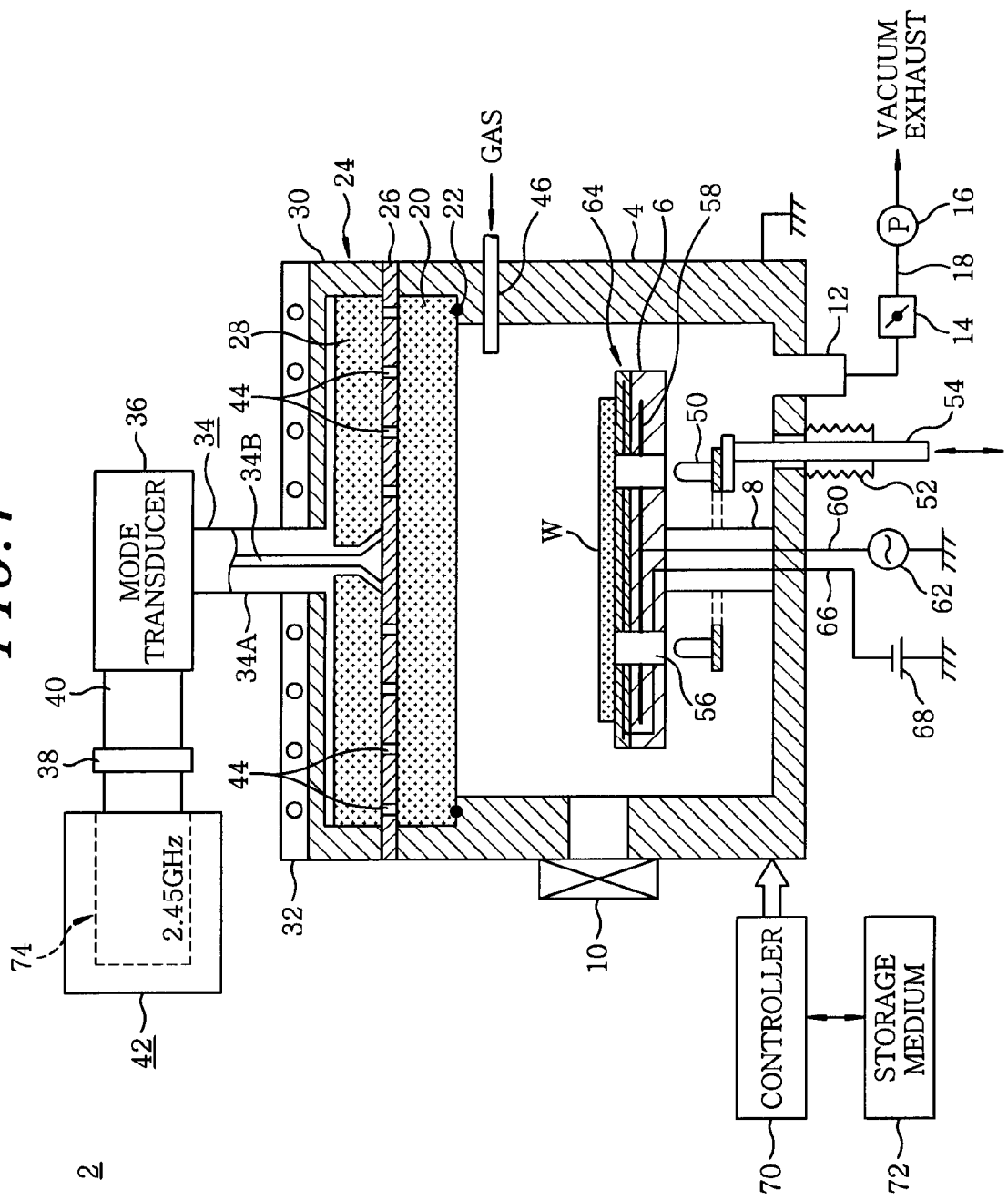
FIG. 1 is a configuration view showing an exemplary processing device using a microwave generation device in accordance with the present invention.
Figure 2:
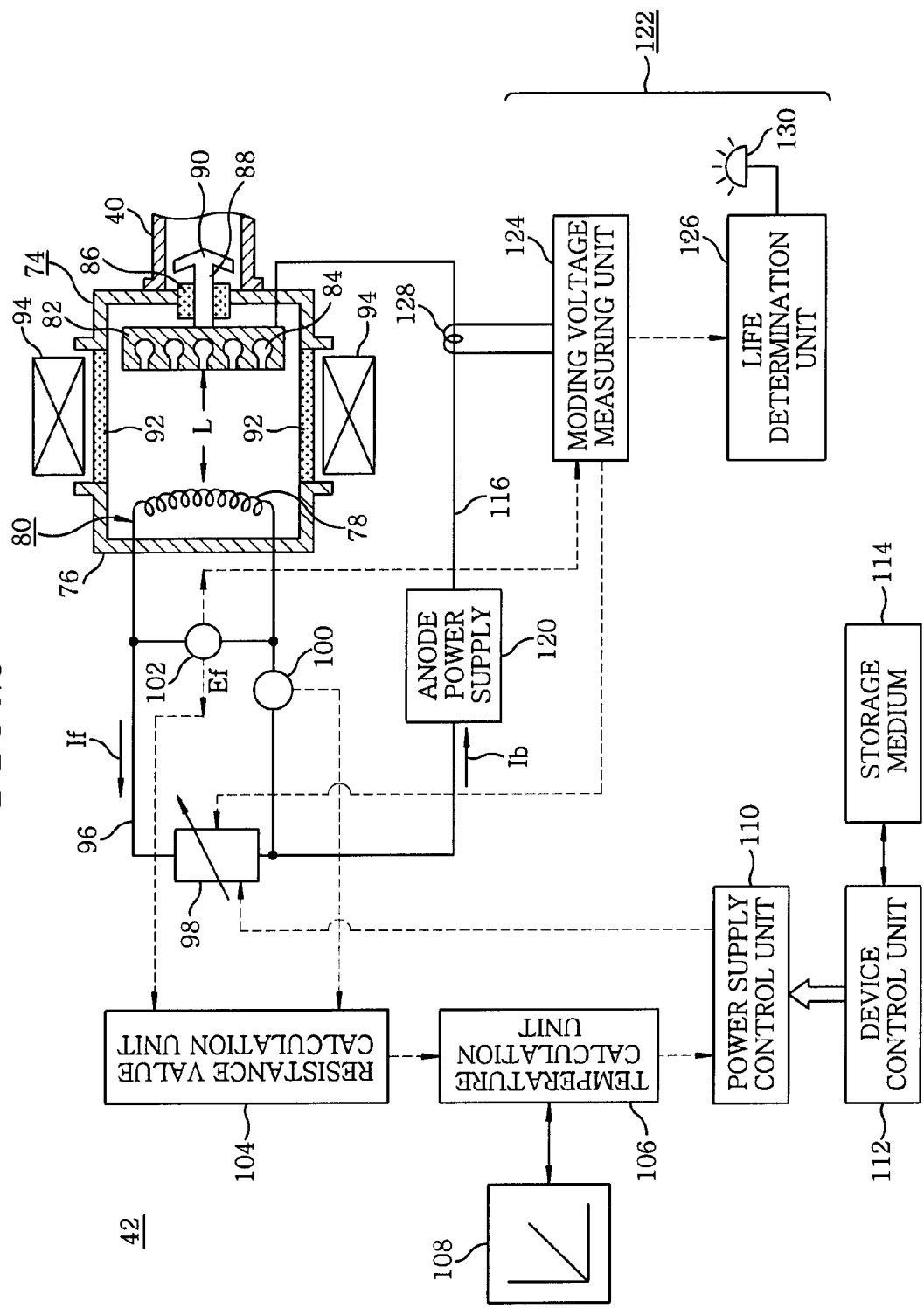
FIG. 2 sets forth a block diagram of the microwave generation device in accordance with the present invention.

FIG. 1 is a configuration view of an exemplary processing device using a microwave generation device in accordance with the present invention, and FIG. 2 sets forth a block configuration diagram of the microwave generation device. Here, description will be provided for the example of performing an etching process by using a plasma generated by a microwave through the use of the processing device.

As shown, the processing device 2 using plasma includes a cylindrical processing vessel 4 whose sidewall and bottom portion are made of a conductive material such as aluminum or the like. The inside of the processing vessel 4 is configured as a hermetically sealed processing space, and a plasma is generated in this processing space. The processing vessel 4 is grounded.

A mounting table 6 for mounting a target object to be processed, e.g., a semiconductor wafer W, on the top surface thereof is installed in the processing vessel 4. The mounting table 6 is of a substantially flat circular plate shape made of, e.g., aluminum which is alumite-treated. The mounting table 6 is disposed spaced apart from the bottom of the processing vessel via a support 8 made of, e.g., aluminum.

Provided on a portion of the sidewall of the processing vessel 4 is a gate valve 10 to be opened for loading/unloading the wafer into/from the inside of the processing vessel 4. Further, a gas exhaust port 12 is provided at a bottom portion of the processing vessel, and connected to the gas exhaust port 12 is a gas exhaust line 18 on which a pressure control valve 14 and a vacuum pump 16 are installed in sequence. With this configuration, the processing vessel 4 can be vacuum-evacuated to a specific pressure level, if required.

Further, the ceiling portion of the processing vessel 4 is opened, and a microwave transmissive top plate 20 made of a ceramic material such as $Al_2O_3$ or the like is airtightly provided at the opening of the ceiling portion via a sealing member 22 such as an O ring. The thickness of the top plate 20 is set to be, for example, about 20 mm in consideration of a pressure resistance.

Disposed on a top surface of the top plate 20 is a microwave irradiating unit 24 for generating a plasma in the processing vessel 4 by a microwave. Specifically, the microwave irradiating unit 24 includes a disk-shaped planar antenna member 26 disposed on the top surface of the top plate 20 and a retardation member 28 disposed on the planar antenna member 26. The retardation member 28 has a high-k property to shorten the wavelength of the microwave. The planar antenna member 26 is configured as a bottom plate of a waveguide box 30 made of a conductive vessel of a hollow cylindrical shape, for enclosing the retardation member 28 entirely. The planar antenna member 26 is provided to face the mounting table 6 in the processing vessel 4. On the waveguide box 30, there is disposed a cooling jacket 32 for flowing a coolant to cool the waveguide box 30.

The peripheral portions of the waveguide box 30 and the planar antenna member 26 are electrically connected with the processing vessel 4. Further, an external tube 34A of a coaxial waveguide 34 is connected to a center of the top portion of the waveguide box 30, and an internal cable 34B inside the external tube 34A is connected to the central portion of the planar antenna member 26 via a through hole provided in the center of the retardation member 28. The coaxial waveguide 34 is connected to a microwave generation device 42 for generating a microwave of, e.g., about 2.45 GHz via a waveguide 40 on which a mode transducer 36 and a matching circuit 38 are installed. The coaxial wave guide 34 serves to transmit the microwave to the planar antenna member 26. The microwave generation device 42 is a feature of the present invention, and its configuration will be explained later. The frequency of the microwave is not limited to 2.45 GHz, but another frequency of, e.g., about 8.35 GHz can be used. As the waveguide 40, one having a circular or rectangular cross section or one having a cylindrical shape can be utilized. The retardation member 28, which has the high-k property and is disposed on the top surface of the planar antenna member 26, shortens the wavelength of the microwave by the wavelength shortening effect. The retardation member 28 may be made of, aluminum nitride, for example.

When designed to correspond to a wafer having a size of about 300 mm, the planar antenna member 26 is formed of a circular plate made of a conductive material, such as a copper or aluminum plate whose surface is silver-plated, having a diameter of, e.g., about 400 to 500 mm and a thickness of, e.g., about 1 to several mm. A plurality of slots 44 as elongated holes is provided in the circular plate. The arrangement of the slots 44 is not limited to a specific pattern. For instance, they can be arranged in concentric, spiral or radial pattern or can be uniformly distributed over the entire top surface region of the antenna member.

A gas introduction mechanism 46 for introducing a processing gas for etching into the processing vessel 4 is disposed above the mounting table 6. Specifically, the gas introduction mechanism 46 is, for example, a gas nozzle made of, e.g., quartz glass. The gas introduction mechanism 46 may have a shower head structure made of quart glass. A desired gas is supplied from the gas supply nozzle 46 while its flow rate is being controlled.

Further, installed below the mounting table 6 are a plurality of, e.g., three elevating pins 50 (only two are shown in FIG. 1) for raising or lowering the wafer W when the wafer W is loaded or unloaded. The elevating pins 50 are moved up and down by an elevation rod 54 which is provided through the bottom portion of the processing vessel 4 via an extendible and contractible bellows 52. Moreover, pin holes 56 for allowing the elevating pins 50 to move therethrough are provided in the mounting table 6. The mounting table 6 is made of a heat resistant material, e.g., ceramic such as alumina, and a heating unit 58 is disposed in the ceramic. The heating unit 58 has a thin-plate shaped resistance heater buried in the mounting table 6 substantially over the entire region thereof. The resistance heater 58 is connected to a heater power supply 62 via a wiring 60 which is provided through the support 8.

Disposed on the top surface of the mounting table 6 is a thin electrostatic chuck 64 having therein a conductor line arranged in, e.g., a mesh pattern. The electrostatic chuck 64 attracts and holds the semiconductor wafer mounted on the mounting table 6, specifically, on the electrostatic chuck 64 itself, by an electrostatic adsorptive force. The conductor line of the electrostatic chuck 64 is connected to a DC power supply 68 via a wiring 66 to exert the electrostatic adsorptive force.

The entire operation of the processing device 2 is controlled by a controller 70 made up of, e.g., a microcomputer or the like. Computer executable programs for executing the operation of the processing device are stored in a storage medium 72 such as a floppy disk, compact disk, a flash memory, a hard disk, and the like. Specifically, a supply of each gas, a control of their flow rates, a supply of a microwave or a high frequency wave, a control of power, a control of a processing temperature or pressure, and the like are performed by commands from the controller 70.

Now, the microwave generation device 42 as the feature of the present invention will be described with reference to FIG. 2. As shown in FIG. 2, the microwave generation device 42 includes a magnetron 74 which generates a microwave of a specific frequency, e.g., about 2.45 GHz. The magnetron 74 includes, in a vacuum case 76 made of, e.g., a metal material, a cathode 80 having a filament 78 and an anode 82 disposed to face the cathode 80. Though FIG. 2 shows only a schematic configuration of the magnetron 74, the cathode 80 is actually formed in, e.g., a cylindrical shape, and the anode 82 having a cylindrical shape is concentrically disposed to surround the cathode 80. The anode 82 has a plurality of recess-shaped hollow resonators 84 at its surface which faces the filament 78.

Further, connected to the anode 82 is an antenna lead 88 extended through the case 76 via an insulating member 86. An antenna 90 is coupled to a leading end portion of the antenna lead 88. A microwave generated by the magnetron 74 is allowed to propagate from the antenna 90 into the waveguide 40.

Two opposite lateral sides (top and bottom sides in the drawing) of the case 76 are made of a nonmagnetic material 92, and by disposing permanent magnets 94 outside the lateral sides, a strong magnetic field perpendicular to an arrangement direction L of the cathode 80 and the anode 82 is formed in a space between the two electrodes.

Here, the anode 82 is formed of, e.g., copper, and the cathode 80 having the filament 78 is made of a tungsten material containing a little amount of thorium. Formed on the surface of the cathode 80 is a carbonized layer such as tungsten carbide ($W_2C$) or the like for facilitating an efficient emission of thermal electrons.

Both ends of the filament 78 are connected via a wiring 96 to filament power supply 98 for supplying a power for heating so that the cathode 80 including the filament 78 can be heated. The filament power supply 98 is capable of varying its output power depending on necessity. A rated voltage of the filament power supply 98 is, e.g., about 5 V.

A current measuring unit 100 for measuring a current flowing in the filament 78 and a voltage measuring unit 102 for measuring a voltage applied to the filament 78 are installed on the wiring 96.

The current value obtained by the current measuring unit 100 and the voltage value obtained by the voltage measuring unit 102 are inputted to a resistance value calculation unit 104, in which a resistance of the filament 78 is estimated based on the current value and the voltage value.

Figure 3:
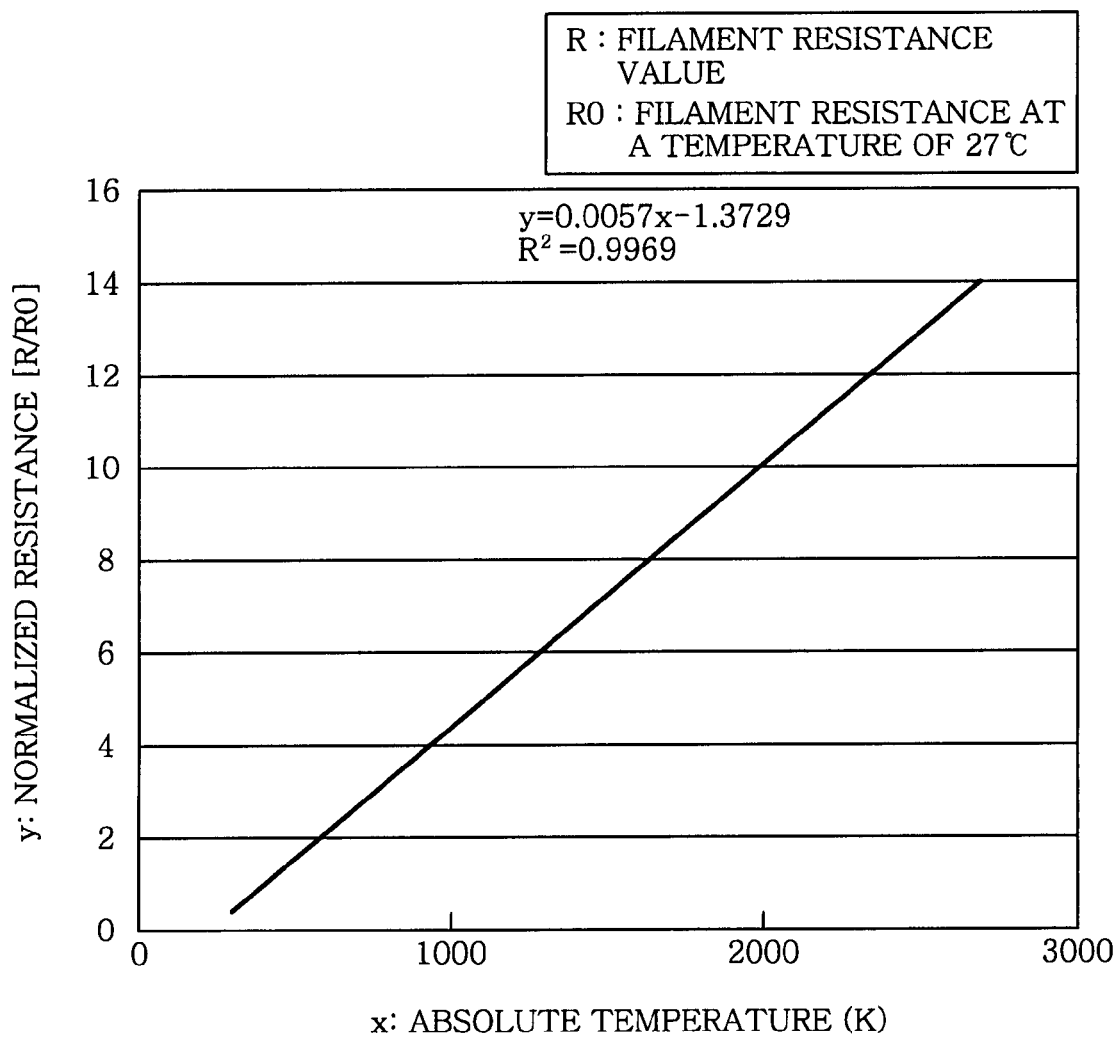
FIG. 3 presents a graph showing a resistance-temperature dependency of a filament.

Further, the resistance value thus obtained is inputted to a temperature calculation unit 106, in which the temperature of the filament 78 is estimated based on a resistance-temperature dependency characteristic which is obtained in advance. The temperature calculation unit 106 has a memory 108 storing therein the resistance-temperature dependency characteristic data, and the temperature of the filament 78 is obtained by referring to the data in the memory 108, for example. FIG. 3 is a graph showing an exemplary resistance-temperature dependency characteristic of the filament, and the data of this graph is stored in the memory 108.

In FIG. 3, an absolute temperature is plotted at a horizontal axis x, and a normalized resistance (R/R0) is plotted at a vertical axis y. Here, "R" represents a filament resistance value and "R0" represents a filament resistance at a temperature of 27° C. In this case, a normalized resistance (R/R0) is expressed by the equation of "y=0.0057x−1.3729", which draws a straight line. Further, in the drawing, "$R^2$" represents a variance amount. Here, since $R^2$=0.9969, it implies that each temperature data is well located on the straight line.

Accordingly, if a resistance value of the filament 78 is obtained, an absolute temperature of the filament 78 at that moment can be obtained from the graph or the equation.

Referring back to FIG. 2, the temperature of the filament 78 obtained by the temperature calculation unit 106 is inputted to a power supply control unit 110. The power supply control unit 110 controls the temperature of the filament 78 to be kept within a specific temperature range by controlling the output power of the filament power supply 98, e.g., a voltage or a current thereof, or both of them. Though the specific temperature range is determined depending on the design of the filament 78, it is generally set to range from about 1900 to 2100° C. Specifically, the temperature is controlled to be maintained at a certain value that falls within the temperature range or to be varied within a narrower temperature range than the above temperature range.

The output of the filament power supply 98 is controlled by, e.g., a phase shift PWM method or by a transistor switch on-off control method. In the phase shift PWM method, the output power is controlled by adjusting a conduction angle, and in the transistor switch on-off control method, the output power is controlled by adjusting a gate current of a transistor switch.

The power supply control unit 110 includes a device control unit 112 for controlling the whole operation of the microwave generating unit 42, including the operation of the magnetron life determination unit. The device control unit 112 has a storage medium 114 such as a floppy disk, a compact disk (CD), a flash memory, or the like, for storing therein a program for use in executing an operation control of the device control unit 112. Further, in the shown example, though the resistance value calculation unit 104, the temperature calculation unit 106, the memory 108, the power supply control unit 110 and the device control unit 112 are individually disposed, they are all integrated in, e.g., a single microcomputer actually. Moreover, the device control unit 112 is operated under the control of the controller 70 shown in FIG. 1.

Meanwhile, a variable anode power supply 120 is connected between the cathode 80 and the anode 82 via a wiring 116, and it serves to apply an electric field oriented toward the cathode 80 from the anode 82. The rated voltage of the anode power supply 120 is, e.g., about 4 kV.

Further, the microwave generation device 42 has a service life judgment device 122 for determining a service life (residual service life) of the magnetron 74. The service life judgment device 122 includes a moding voltage measuring unit 124 for measuring a voltage applied to the filament 78 at the moment when a moding phenomenon occurs and setting it as a moding voltage; and a service life judgment unit 126 for determining the service life of the magnetron 74 based on the moding voltage so obtained.

The moding voltage measuring unit 124 has a current detector 128 provided on the wiring 116 connected to the anode power supply 120. By measuring a current flowing in the wiring 116, the moding voltage measuring unit 124 detects a presence or absence of a moding phenomenon. When the moding voltage measuring unit 124 measures the moding voltage, the output voltage of the filament power supply 98 is controlled to be gradually reduced from the rated value, and the moding voltage measuring unit 124 recognizes the voltage applied to the filament at that moment by receiving an output of the voltage measuring unit 102.

Here, a moding phenomenon is a phenomenon that the oscillation of the magnetron takes place at a frequency band other than a preset frequency or that the oscillation of the magnetron is stopped or becomes instable. If the moding phenomenon occurs, an anode current Ib fluctuates rapidly. Therefore, by detecting the anode current Ib, the occurrence of the moding phenomenon can be detected.

Further, the service life judgment unit 126 has an indicator 130 for informing an operator of the expiration of the service life of the magnetron in the event it is determined that the service life of the magnetron has expired. The indicator 130 can be an alarm lamp, an alarm buzzer, or a printer that prints the determination result. Moreover, the determination result is preferably reported to the controller 70 shown in FIG. 1. Each of the moding voltage measuring unit 124 and the service life judgment unit 126 is made up of, e.g., a microcomputer or the like.

Now, a specific processing, e.g., an etching process, which is performed by using the processing apparatus 2 having the above configuration, will be explained.

First, a semiconductor wafer W is loaded into the processing vessel 4 by a transfer arm (not shown) through the gate valve 10, and by moving the elevating pins 50 up and down, the wafer W is mounted on a top surface, i.e., a mounting surface of the mounting table 6. Then, the wafer W is attracted and held by the electrostatic chuck 64 electrostatically.

The wafer W is maintained at a certain processing temperature by the heating unit 58, and a processing gas, e.g., an etching gas is supplied into the processing vessel 4 from the gas introduction mechanism 46 at a certain flow rate, while the inner pressure of the processing vessel 4 is kept at a certain pressure level by controlling a pressure control valve 14. At the same time, a microwave is generated by operating the microwave generation device 42, and the generated microwave is supplied into the planar antenna member 26 via the waveguide 40 and the coaxial waveguide 34. The microwave is then introduced into the processing space after its wavelength is shortened by the retardation member 28, whereby a plasma is generated in the processing space, and the etching process is performed by using the plasma.

As described, if the microwave is introduced into the processing vessel 4 from the planar antenna member 26, the gas supplied in the processing space is converted into the plasma and activated by the microwave. By active species generated at that time, the surface of the wafer W can be efficiently etched even at a low temperature.

Here, if necessary, the output of the magnetron 74 of the microwave generation device 42 is increased or decreased by adjusting an output voltage of the anode power supply 120 depending on processing conditions and the like.

Figure 4A:
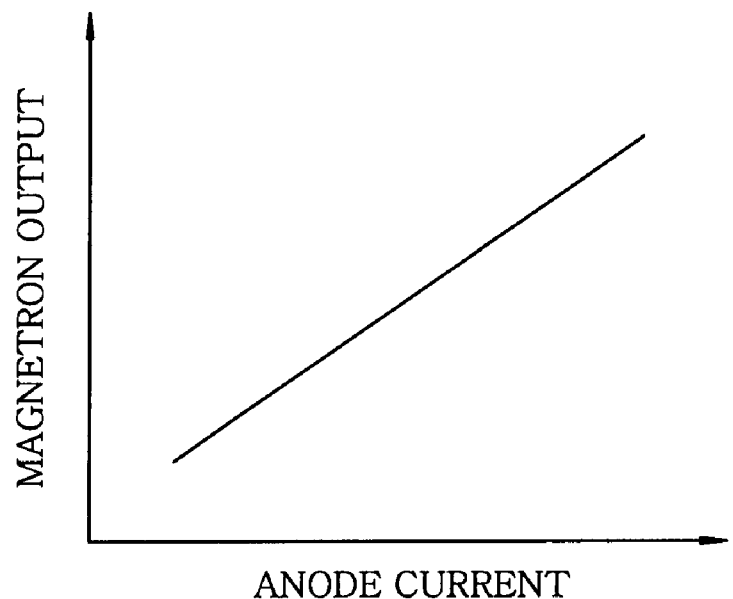
FIGS. 4A and 4B provide graphs showing relationships between an anode current and a magnetron output and between the anode current and a filament voltage, respectively.
Figure 4B:
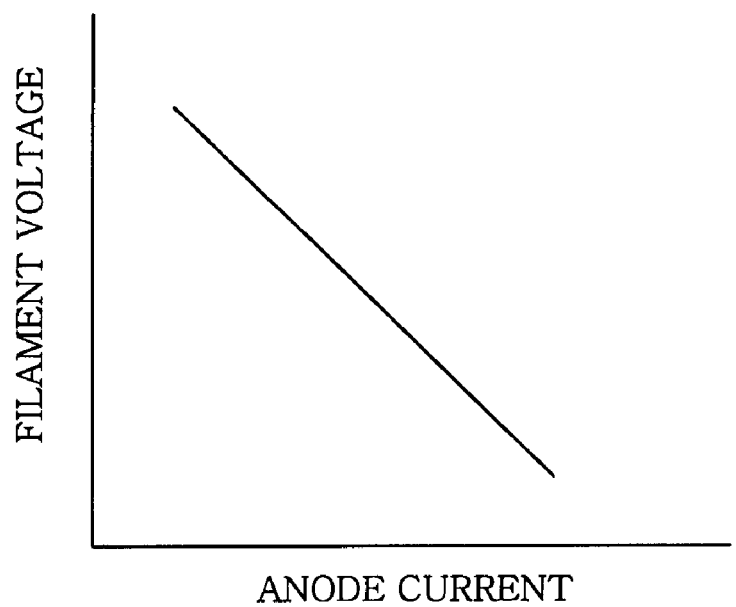

FIG. 4A is a graph showing a relationship between an anode current and a magnetron output, and FIG. 4B is a graph showing a relationship between the anode current and a filament voltage. As described above, if the anode current Ib is increased by adjusting the anode power supply 120, the magnetron output also increases in a substantially linear manner, as illustrated in FIG. 4A. In such case, if the filament voltage is not adjusted at all, the temperature of the filament 78 would increase excessively, resulting in a reduction of the lifetime of the magnetron, as described above. Therefore, as shown in FIG. 4B, by reducing a voltage applied to the filament (filament voltage) gradually as the anode current Ib increases, the service life of the magnetron can be extended. In such a case, not only the filament voltage is controlled to be reduced but also the temperature of the filament is controlled to be kept within a temperature range from, e.g., about 1900 to 2100° C.

Hereinafter, the aforementioned control method for the magnetron will be explained in further detail with reference to FIG. 5.

Figure 5:
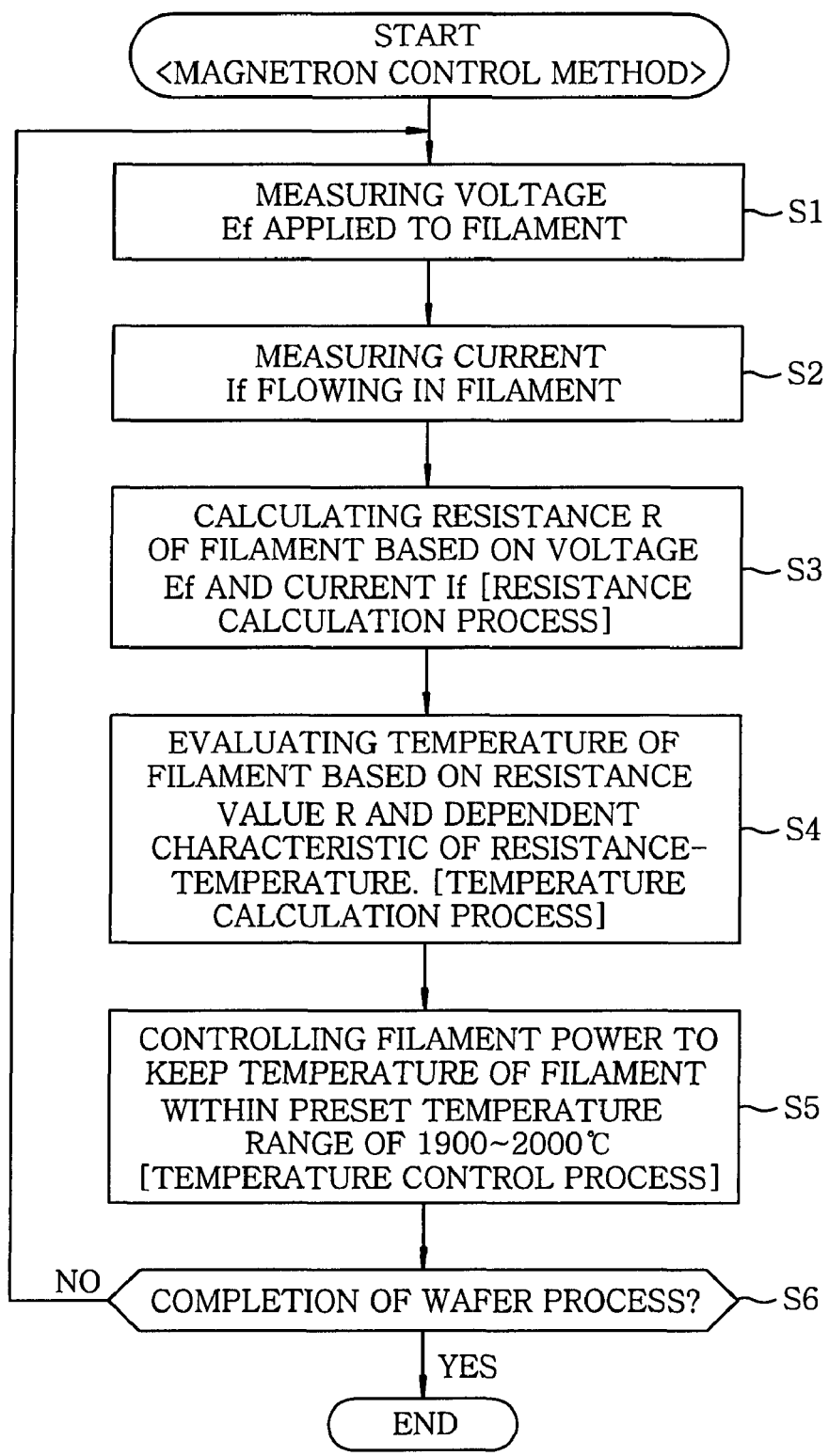
FIG. 5 depicts a flowchart describing an exemplary magnetron control method.

FIG. 5 sets forth a flowchart to describe an exemplary magnetron control method.

Referring back to FIG. 2, if the microwave generation device 42 is operated, a specific voltage, e.g., a rated voltage is applied from the filament power supply 98 to the filament 78 to power the filament 78, and the cathode 80 including the filament 78 is heated, whereby thermal electrons are emitted from the cathode 80.

At the same time, a certain voltage is applied between the cathode 80 and the anode 82 from the anode power supply 120, whereby an electric field is generated between the two electrodes. Here, since a strong magnetic field is formed by the permanent magnets 94 in a direction perpendicular to the electric field, an oscillation phenomenon occurs, whereby a microwave of a frequency of, e.g., about 2.45 GHz is generated. This microwave propagates through the waveguide 40 via the antenna 90.

During these operations, even when the output of the magnetron is varied depending on processing conditions and the like, an excessive temperature rise of the filament should be restrained to prevent the magnetron from suffering a decrease of its service life. The process sequence therefor is as follows. Operations to be described hereinafter are performed in response to commands from the device control unit 112 based on programs stored in the storage medium 114.

First, the thermal electron emission phenomenon of this magnetron having a similar structure to a bipolar vacuum tube has a temperature limited state and a space charge limited state. In the former state, since thermal electrons all flow to the anode, an anode current is applied by a function of an absolute temperature of the filament only. In the latter state, on the other hand, since the thermal electrons are repelled due to space charge, the current value cannot exceed a specific level, and the current at that time is in proportion to (anode voltage)$^{3/2}$. Accordingly, with cathode temperature, i.e., an uniform filament current, while the anode voltage is low, the anode current is defined as describe above in the space charge limited state, and after shifting to the temperature limited state, a uniform temperature-limited current determined by the temperature of the cathode flows.

Further, while the cathode voltage increases, i.e., while the cathode current increases, the thermal electron emission amount per a unit period increases, so that an anode voltage at which the space charge limited state shifts to the temperature limited state is gradually raised.

Here, the control method of the present invention is performed in the space charge limited state by heating the cathode over a certain temperature level.

First, in an operational mode of the magnetron 74, a voltage Ef applied from the filament power supply 98 to the filament 78 is measured by the voltage measuring unit 102 (S1). At the same time, a current If flowing in the filament 78 is measured by the current measuring unit 100 (S2).

Then, the resistance value calculation unit 104 calculates a resistance R of the filament 78 based on the voltage Ef and the current If (S3), and the resistance calculation process is completed.

Thereafter, the temperature calculation unit 106 evaluates an absolute temperature of the filament 78 by calculating a ratio R/R0 between the resistance R of the filament 78 and a resistance R0 of the filament 78 at a temperature of 27° C., while referring to the function as shown in FIG. 3 stored in the memory 108 (S4), the resistance R0 being obtained in advance. Then, the temperature calculation process is completed.

Next, based on the thus obtained absolute temperature of the filament 78, the power supply control unit 110 controls an output power of the filament power supply 98, i.e., either the voltage applied to the filament or the current flowing in the filament 78 or both of them, in order to keep the temperature of the filament 78 within a preset temperature range of, e.g., about 1900 to 2100° C. (S5). In this way, the temperature control process is performed. In such a case, the temperature of the filament 78 may be kept within a narrower temperature range of, e.g., about 1950 to 2050° C. In either case, the temperature of the filament 78 is kept at a predetermined value or within a predetermined temperature range.

The series of steps S1 to S5 are continuously performed until the processing of the wafer W is completed (NO of S6), and if the processing of the wafer W is finished (YES of S6), the operation of the magnetron 74 is stopped and the process is terminated.

As described, since the temperature of the filament is kept within the specific temperature range by adjusting the voltage applied to the filament or the current flowing in the filament 78, it is possible to control the temperature of the filament 78 with a high precision without causing structural complication. As a result, the service life of the magnetron 74 can be lengthened.

Here, the filament temperature range from 1900 to 2100° C. specified above is just an example, and it can be varied depending on the design of the filament 78 and the like.

Figure 6:
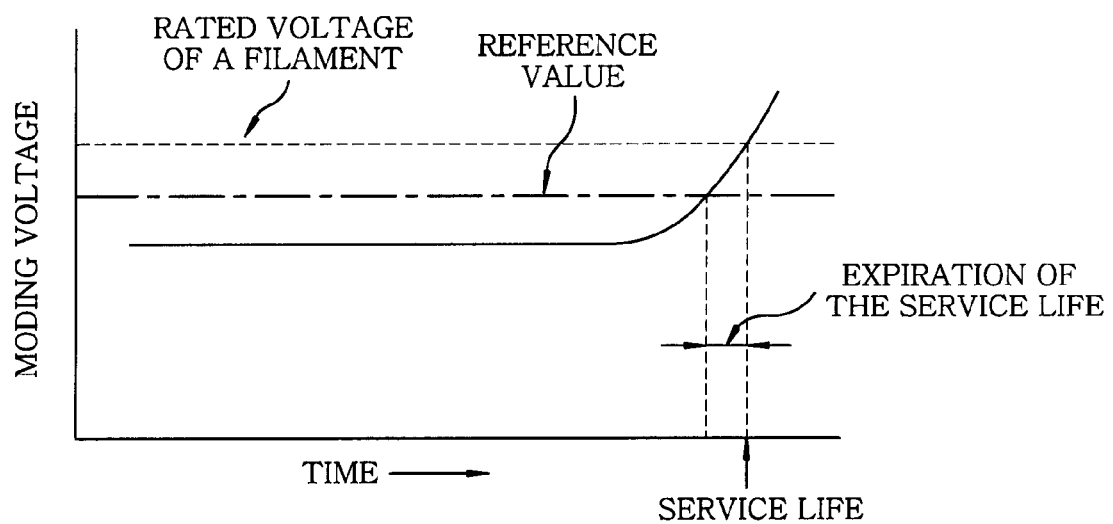
FIG. 6 illustrates a graph showing a general variation of a moding voltage before the service life of a magnetron expires.
Figure 7:
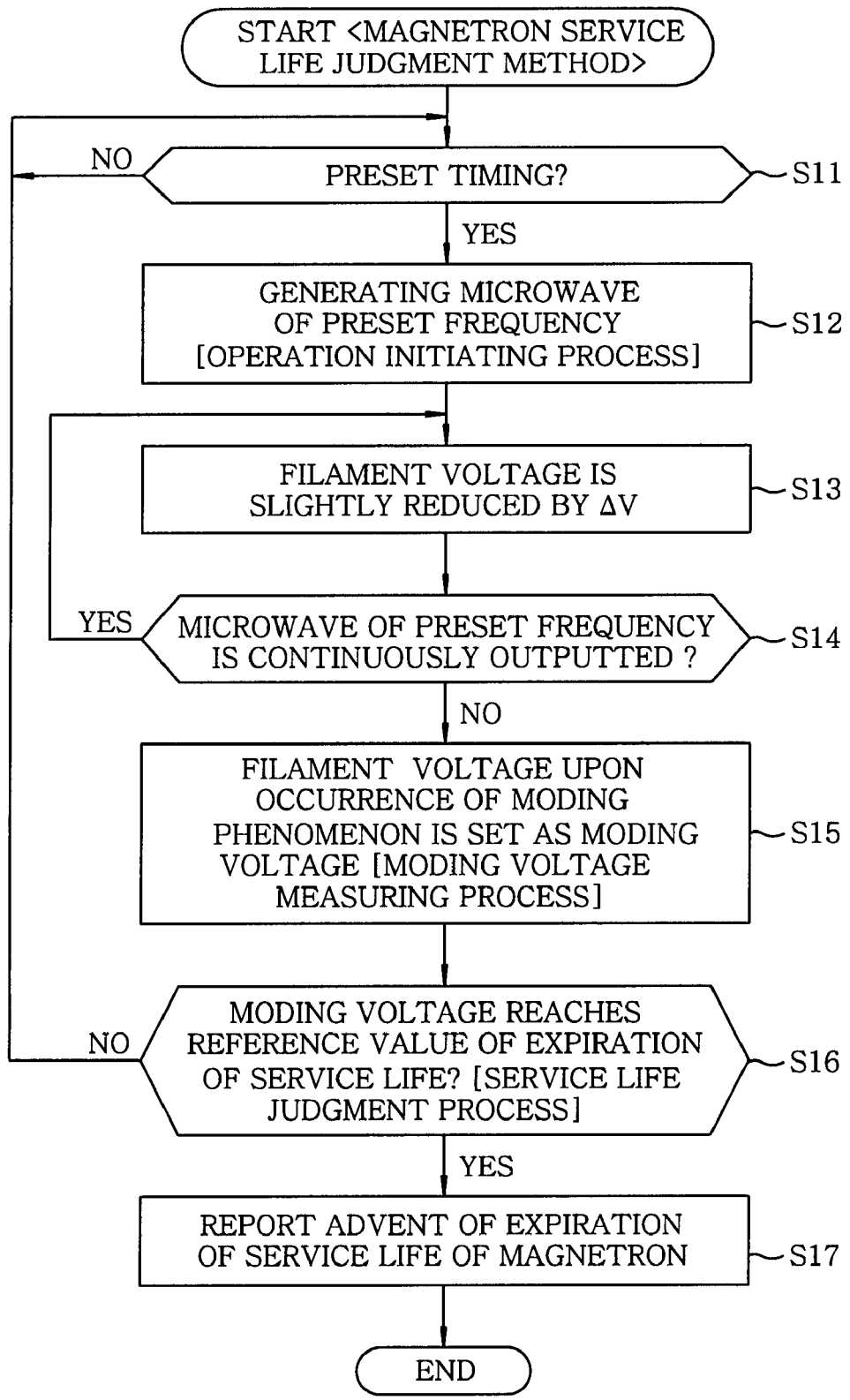
FIG. 7 offers a flowchart describing an exemplary magnetron service life judgment method in accordance with the present invention.

Now, a service life judgment method performed by using the magnetron service life judgment device 122 will be explained. FIG. 6 is a graph showing a general variation of a moding voltage before the service life of the magnetron expires, and FIG. 7 sets forth a flowchart to explain an exemplary magnetron service life judgment method. Here, a moding phenomenon is a phenomenon that the oscillation of the magnetron takes place at a frequency band other than a present frequency or the oscillation of the magnetron is stopped or becomes instable, as defined earlier.

As shown in FIG. 6, a moding voltage, which means a voltage applied to the filament at the moment when the moding phenomenon occurs, is maintained substantially constant at a voltage level less than the rated voltage of the filament, in general, and if the expiration of the service life of the magnetron approaches, the moding voltage increases rapidly. If the moding voltage reaches the rated voltage of the filament, the service life of the magnetron finally expires. Accordingly, by detecting a time point when the moding voltage increases rapidly, it can be expected that the magnetron service life will expire in a short period of time.

First, the magnetron service life judgment method is performed at a preset timing (S11). The timing may be, for example, every time a specific number of, e.g., one lot of 25 wafers are processed or every time the total operating time of the magnetron 74 reaches certain values, after the operation of the processing apparatus is started. In particular, in order not to reduce the operating rate of the processing apparatus, it is preferable to perform the magnetron service life judgment method during, e.g., an idle period in which the wafer is not processed.

When the timing for the determination of the service life of the magnetron 75 comes (YES of S11), an operation initiating process is performed so that the magnetron 74 is driven to generate a microwave of a preset frequency, e.g., about 2.45 GHz (step S12). In this case, a rated voltage is applied between the cathode 80 and the anode 82 from the anode power supply 120, and a rated voltage is applied to the filament 78 from the filament power supply 98. At this time, the inside of the processing vessel 4 is kept empty without loading a wafer to be processed therein or a dummy wafer is loaded in the processing vessel 4 if necessary.

Then, the voltage to the filament 78 is slightly reduced by ΔV (S13), and it is determined whether the microwave of the preset frequency of, e.g., about 2.45 GHz is continuously outputted based on an anode current Ib detected by the current detector 128 (S14). Here, if the microwave of, e.g., about 2.45 GHz is continuously outputted, the anode current Ib flows stably. However, if the frequency of the microwave or the microwave oscillation becomes unstable, that is, if the moding phenomenon takes place, the anode current Ib becomes unstable, too. Accordingly, until the anode current Ib becomes unstable, the filament voltage is gradually reduced by $\Delta V$. That is, the steps from S13 to S14 are repeated (YES of S14).

If the anode current Ib becomes unstable as a result of the instabilization of the microwave oscillation (No of S14), it is determined that the moding phenomenon has occurred, and a filament voltage Ef at the moment is detected by the voltage measuring unit 102 and is set as a moding voltage (moding voltage measuring process) (S15).

Subsequently, the service life judgment device 126 determines whether the magnetron 74 reaches a reference value indicating an upcoming expiration of the magnetron service life based on the moding voltage (service life judgment process) (S16).

Referring to FIG. 6, the reference value indicating the upcoming expiration of the service life is set to be a voltage value at a time point where the moding voltage rapidly increases in a final period of the residual lifetime of the magnetron. For example, the reference value is set in advance to correspond to some percentage (%) of the rated voltage of the filament. For example, the reference value falls within a range from about 85 to 90% of the rated voltage of the filament, and a certain value within this range, e.g., 88% is set as the reference value in advance. This reference value is appropriately set by considering the operational status of the apparatus and the like.

As shown in FIG. 6, the time period after reaching the reference value indicating the upcoming expiration of the magnetron service life before the expiration of the service life finally comes is a residual lifetime period of the magnetron during which the magnetron can be still operated. Further, in other reference value measurement method than that described above, the reference value can be set to be a voltage value increased by some percentage (%), e.g., about 10%, from a stabilized moding voltage, in the graph shown in FIG. 6.

If it is determined that the moding voltage is lower than the reference value (No of S16), the process returns to the step S11, and the steps from S11 to S15 are repeated.

On the other hand, if the moding voltage is equal to or higher than the reference value (YES of S16), the indicator 130, for example, is operated to report the advent of the expiration of the service life of the magnetron 74 to an operator (step S17). Through the above process, the magnetron service life judgment method is completed.

As described above, by inspecting the variation of the moding voltage, the expiration of the service life (residual lifetime) of the magnetron 74 can be detected. Thus, it is possible to, for example, replace the magnetron 74 with a new one immediately before its service life expires.

Further, though the above embodiment has been described for the case of performing the etching by using the plasma generated by the microwave, the present invention can also be applied to various processings such as a film forming process, a sputtering process, an etching process, and the like.

Moreover, in the above embodiment, though the planar antenna member 26 is used as the microwave irradiating unit 24 and the microwave radiated from the planar antenna member 26 is directly introduced into the processing vessel 4 to activate the gas therein, it is also preferable to use a so-called remote plasma generating unit as the microwave irradiating unit 24. In such case, the microwave is irradiated to the gas at the outside of the processing vessel 4 to activate it, and the activated gas is then introduced into the processing vessel 4.

Further, the target object is not limited to the semiconductor wafer, but it can be a glass substrate, an LCD substrate, a ceramic substrate, or the like.

While the invention has been shown and described with respect to the embodiment, it will be understood by those skilled in the art that various changes and modifications may be made without departing from the scope of the invention as defined in the following claims.

What is claimed is:

1. A method for determining a service life of a magnetron for generating a microwave, the magnetron including a cathode having a filament, an anode having a cavity resonator and disposed to face the cathode, and a magnetic field generating unit for applying a magnetic field in a direction substantially perpendicular to an arrangement direction of the cathode and the anode, the method comprising:
   supplying a power to the filament and operating the magnetron to generate a microwave of a preset frequency;
   detecting a voltage at which a moding phenomenon occurs by gradually reducing a voltage applied to the filament, and setting the detected voltage as a moding voltage; and
   determining the service life of the magnetron based on the moding voltage.

2. The method of claim 1, wherein in determining the service life of the magnetron, it is determined that the service life of the magnetron has expired when the moding voltage reaches a preset percentage of a rated voltage of the filament, or greater.

3. The method of claim 1, wherein in determining the service life of the magnetron, it is determined that the service life of the magnetron has expired when the moding voltage changes from a previously obtained moding voltage by a preset percentage or greater.

4. The method of any one of claims 1 to 3, wherein the method for determining the service life of the magnetron is performed at a preset timing.

5. A magnetron service life judgment device for determining a service life of a magnetron for generating a microwave, the magnetron including a cathode having a filament, an anode having a cavity resonator and disposed to face the cathode, and a magnetic field generating unit for applying a magnetic field in a direction substantially perpendicular to an arrangement direction of the cathode and the anode, the device comprising:
   a moding voltage measuring unit that detects a voltage at which a moding phenomenon takes place by gradually reducing a voltage applied to the filament and setting the detected voltage as a moding voltage; and
   a service life judging unit that judges the service life of the magnetron based on the moding voltage.

6. The magnetron service life judgment device of claim 5, wherein the service life judgment unit determines that the service life of the magnetron has expired when the moding voltage reaches a preset percentage of a rated voltage of the filament, or greater.

7. The magnetron service life judgment device of claim 5, wherein the service life judgment unit determines that the service life of the magnetron has expired when the moding voltage changes from a previously obtained moding voltage by a preset percentage or greater.

8. A processing apparatus comprising:
a vacuum evacuable processing vessel;
a mounting table that mounts thereon a target object to be processed;
a gas introduction unit that introduces a gas into the processing vessel;
a microwave generating unit that generates a microwave;
a waveguide that transfers the generated microwave; and
a microwave irradiating unit that irradiates the transferred microwave to the gas to activate the gas,
wherein the microwave generating unit includes:
a magnetron that generates a microwave, the magnetron including a cathode having a filament, an anode having a cavity resonator and disposed to face the cathode, and a magnetic field generating unit that applies a magnetic field in a direction substantially perpendicular to an arrangement direction of the cathode and the anode;
a filament power supply that supplies a variable power to the filament;
a current measuring unit that measures a current flowing in the filament;
a voltage measuring unit that measures a voltage applied to the filament;
a resistance value calculation unit that calculates a resistance of the filament based on the current of the filament obtained by the current measuring unit and the voltage of the filament obtained by the voltage measuring unit;
a temperature calculating unit that calculates a temperature of the filament based on the resistance obtained by the resistance value calculation unit and a resistance-temperature dependency characteristic obtained previously;
a power supply control unit that controls the filament power supply to maintain the temperature of the filament obtained by the temperature calculating unit within a specific temperature range; and
a magnetron service life judging device including:
a moding voltage measuring unit that detects a voltage at which a moding phenomenon takes place by gradually reducing a voltage applied to the filament and setting the detected voltage as a moding voltage; and
a service life judging unit that determines the service life of the magnetron based on the moding voltage.

9. The processing apparatus of claim 8, wherein the microwave irradiating unit is made of a planar antenna member having a plurality of slots.

\* \* \* \* \*